July 24, 1962 E. ROOT III 3,046,494

TRANSISTOR OSCILLATOR CIRCUIT

Filed June 2, 1959

INVENTOR.

ELIHU ROOT III

BY Richard von K. Bruns

Attorney

United States Patent Office 3,046,494
Patented July 24, 1962

3,046,494
TRANSISTOR OSCILLATOR CIRCUIT
Elihu Root III, Clinton, N.Y., assignor to R. E. Dietz Company, Syracuse, N.Y., a corporation of New York
Filed June 2, 1959, Ser. No. 817,508
4 Claims. (Cl. 331—111)

This invention relates generally to electrical signal generators, and has particular reference to such circuits wherein semi-conductor devices are utilized.

The circuit of the invention is particularly adapted for use in flasher type hazard warning lamps, such as may be used to warn motorists of road repairs or disabled vehicles, although it will be apparent as the description proceeds that it can also be advantageously employed for various other purposes. In this connection, reference is made to U.S. Patent No. 2,829,257, issued April 1, 1958 to the applicant, which patent discloses a semi-conductor circuit of the type referred to above and points out some of the advantages of such a circuit over prior electrical arrangements.

The circuit to be disclosed herein primarily differs from the applicant's earlier patented circuit in that it enables a longer dwell and slower flash rate, and also enables better control over these operational factors. Accordingly, it may be stated that the primary object of the present invention is to provide an electronic switching device having these characteristics.

Another important object of the invention is to provide an electronic switching device for a flasher warning lamp which is simple and economical in construction and also is highly stable and efficient in operation.

A further important object of the invention is to provide an electronic switching device which operates on a low voltage source of direct current.

A still further important object of the invention is to provide an electronic switching device wherein the timing of the operating cycles is uniform and closely controlled.

A more specific object of the invention is to provide a transistor oscillator circuit employing a pair of coacting transistors.

Another specific object of the invention is to provide a transistor oscillator circuit wherein a low value capacitor is employed to render said transistors conductive.

Still another specific object of the invention is to provide a transistor oscillator circuit wherein the effect of variations in the internal resistance of the transistors is reduced to a minimum.

Other objects and advantages of the invention will become apparent from the following detailed description thereof read in conjunction with the accompanying drawings which illustrate a representative embodiment of the invention for the purpose of disclosure.

Figure 1:
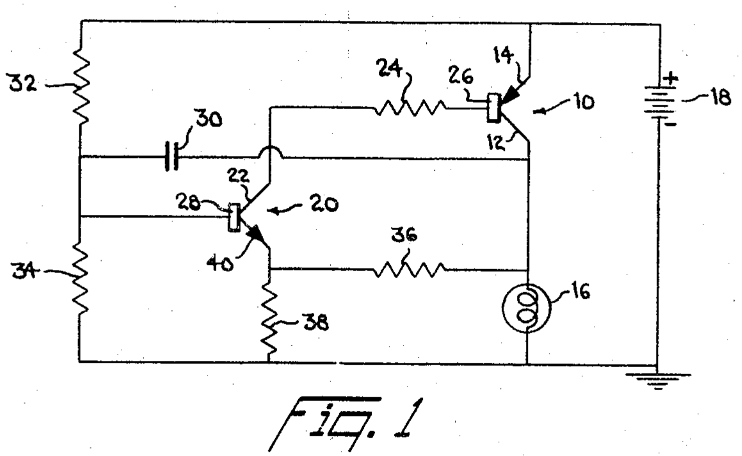
FIGURE 1 is a schematic circuit diagram of a transistor oscillator circuit arranged in accordance with the present invention.

Having reference now to the drawings, wherein like reference numbers designate the same element in each of the views, and with particular reference to FIGURE 1, 10 generally indicates a semi-conductor device having its collector and emitter electrodes 12 and 14 interconnected through a load 16 and source of direct current 18. For the type of flasher warning lamp contemplated, the current source is preferably a 6 volt battery, and in the illustrated embodiment the negative terminal of this battery is connected to a point of reference potential or ground. The load 16, of course, is in the form of an electric lamp bulb when the circuit is used as a flasher warning device.

The semi-conductor 10 is shown, by way of example, as being a junction transistor of the PNP type, and this transistor is arranged to coact in the circuit with a complementary NPN junction transistor generally indicated at 20. To this end, the collector electrode 22 of transistor 20 is connected through a resistor 24 to the base electrode 26 of transistor 10, and the base electrode 28 of transistor 20 is connected through a capacitor 30 to the collector electrode 12 of transistor 10. A voltage divider comprising resistors 32, 34 is also connected in circuit across the battery 18, and the base electrode 28 of transistor 20 is connected to the common junction of these resistors. A second voltage divider comprising resistors 36, 38 is connected between the collector electrode 12 of transistor 10 and ground, the emitter electrode 40 of transistor 20 being connected to the common junction of the resistors as shown.

Before describing the operation of the circuit it should be noted that when transistor 10 is not conducting, its collector electrode 12 is at substantially ground potential and likewise the emitter electrode 40 of transistor 20 is at substantially ground potential. However, when transistor 10 conducts, the voltage divider formed by resistors 36 and 38 tends to raise emitter 40 to a potential between that of the battery and ground. In addition, before either transistor starts to conduct, the voltage divider formed by resistors 32, 34 tends to raise the base electrode 28 of transistor 20 to a potential between ground and the potential applied to emitter 40 when transistor 10 is conducting. Accordingly, if the collector electrode 12 is held at constant potential (as when transistor 10 is not conducting) and the control current from the base to emitter electrodes of transistor 20 is neglected, the base electrode 28 always exponentially approaches the potential referred to just above with a time constant determined by the capacitance of capacitor 30 and a resistance equivalent to resistors 32, 34 in parallel.

With the above considerations in view, the operation of the circuit is substantially as follows: At the start of a cycle, both transistors are momentarily non-conducting, and the base electrode 28 of transistor 20 is at a potential which is below ground. The battery 18 supplies current through voltage divider 32, 34 to discharge the capacitor, and the potential at the base rises exponentially. When this potential reaches a point just above ground, transistor 20 begins to conduct and, by reason of the coupling between the collector 22 of transistor 20 and base 26 of transistor 10, the latter also begins to conduct. When this happens, the coupling from collector 12 of transistor 10 through capacitor 30 to the base 28 of transistor 20 causes the latter to draw more current and both transistors become fully conducting due to regenerative action.

As a result of the above action, the collector 12 of transistor 10 rises to a potential that is substantially full battery voltage thereby turning on lamp 16 fully. At the same time, collector 12 acting through capacitor 30 carries the potential of base 28 of transistor 20 to substantially full battery voltage, and the emitter 40 of this transistor is raised above ground to an intermediate potential due to its connection with voltage divider 36, 38. The potential at the base 28 of transistor 20 then starts falling exponentially, the time constant of this fall still being controlled primarily by the combination of resistors 32, 34 since resistors 36, 38 allow emitter 40 to rise slightly above its applied intermediate potential by emitter follower action and thereby prevent the dumping of excessive control current from the base to emitter of transistor 20.

When the potential at the base 28 of transistor 20 falls to a point just above the intermediate potential applied to the emitter 40, transistor 20 starts to cut off and the current through its collector 22 becomes insufficient to maintain transistor 10 in full conduction. As a result, the potential at the collector 12 of transistor 10 drops and regeneratively causes the potential at the base 28 of transistor 20 to drop more rapidly so that both transistors shut off quickly. The potential at the base electrode 28 then returns to its below ground starting point, and a new cycle begins.

In the above described circuit, the ratio of on time to off time of the lamp can be varied by adjusting the ratio of resistor 32 to resistor 34 to change the potential to which the voltage divider tends to raise the base 28 of transistor 20. In addition, the frequency can be adjusted by varying the value of capacitor 30 or by varying both resistors 32, 34 in the same proportion. In this connection, it should be noted that resistor 24 is not normally used for long dwell times but is employed when short dwell times are desired since it causes transistor 20 to saturate before the base 28 thereof reaches full battery potential thereby allowing additional current to flow from the base to emitter of this transistor.

Figure 2:
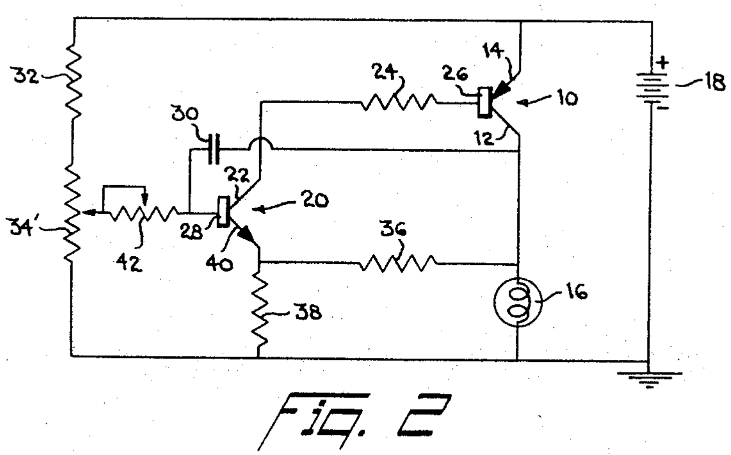
FIGURE 2 is a slightly modified form of the circuit shown in FIGURE 1.

In accordance with the foregoing, FIGURE 2 illustrates a slightly modified form of the circuit which incorporates adjustable means for affording a degree of independence between the frequency control and on to off ratio. To this end, a potentiometer 34′ is substituted for resistor 34, and a second potentiometer 42 is included in the connection between potentiometer 34′ and the base 28 of transistor 20, the potentiometer 34′ controlling on to off ratio and the potentiometer 42 controlling frequency. The potentiometer 34′ may have a relatively low resistance.

Figure 3:
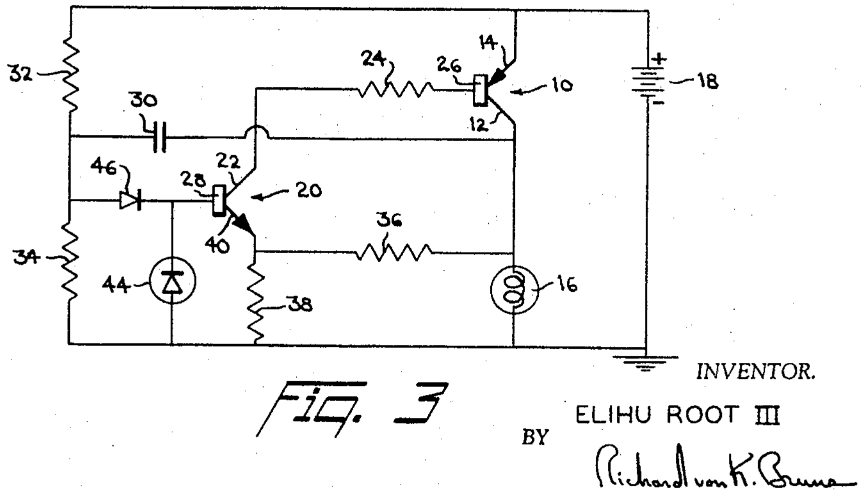
FIGURE 3 is another modified form of the circuit shown in FIGURE 1.

Since flasher warning lamps may be left on a barricade or the like for several days without being attended to, FIGURE 3 illustrates a modification of the circuit which includes a photocell for rendering the circuit inoperative during the daylight hours. The photocell 44, which may be of the selenium self-generating type, is connected between the base 28 of transistor 20 and ground, and a diode 46 may be incorporated between the voltage divider 32, 34 and the base electrode of transistor 20 as shown. In the presence of sufficient ambient light, photocell 44 generates a current which flows in the normally non-conductive direction of the cell considered as a diode. As long as the cell current is larger than that supplied by battery 18 through resistor 32, transistor 20 and hence transistor 10 will not conduct. The diode 46, while not absolutely necessary, prevents interference with the timing by discharge of current through the photocell in its conductive direction (considered as a diode in the dark), when transistor 20 is biased off. Diode 46 can be replaced by a resistor with some sacrifice in effectiveness.

While the invention has been described with transistor 10 as a PNP type and transistor 20 as an NPN type for the purpose of disclosure, it will be understood that the two transistors could be interchanged in the circuit by reversing the polarity of the battery, diode and photocell.

As will be apparent to those familiar with the art, the invention may be embodied in other specific forms without departing from the spirit or essential characteristics thereof. The embodiment disclosed is therefore to be considered in all respects as illustrative and not restrictive, the scope of the invention being indicated by the appended claims.

What is claimed is:

1. In a transistor oscillator circuit having a point of reference potential: a first transistor having its collector and emitter electrodes interconnected through a load and a source of direct current; a second transistor having its collector electrode connected to the base electrode of said first transistor, the emitter electrode of said second transistor being connected in said circuit so that its potential is substantially equal to said reference potential when said transistors are not conducting; means in said circuit including a capacitor connected between the base electrode of said second transistor and collector electrode of said first transistor to alter the potential at the base electrode of said second transistor relative to the potential at the emitter electrode thereof whereby said second transistor is rendered conductive and energizes the base electrode of said first transistor to enable a closed circuit to be established through said source, load and first transistor; a voltage divider connected between the collector electrode of said first transistor and said point of reference potential; the emitter electrode of said second transistor being connected to an intermediate point on said voltage divider; said voltage divider being operable when said first transistor is conducting to establish a potential at the emitter electrode of said second transistor which is intermediate that of said source and said point of reference potential whereby the second transistor is rendered non-conductive at a different base potential than that at which it is rendered conductive.

2. In a transistor oscillator circuit having a point of reference potential: a source of direct current, a load and a first transistor connected in series; a second transistor having its collector electrode connected to the base electrode of said first transistor, the emitter electrode of said second transistor being connected in said circuit so that its potential is substantially equal to said reference potential when said transistors are not conducting; a first voltage divider connected across said source; the base electrode of said second transistor being connected to an intermediate point on said voltage divider; a capacitor connected between the base electrode of said second transistor and the collector electrode of said first transistor; said first voltage divider and capacitor cooperating to alter the potential at the base electrode of said second transistor relative to the potential at the emitter electrode thereof whereby said second transistor is rendered conductive and energizes the base electrode of said first transistor to enable a closed circuit to be established through said source, load and first transistor; and a second voltage divider connected between the collector electrode of said first transistor and said point of reference potential; the emitter electrode of said second transistor being connected to an intermediate point on said second voltage divider; said second voltage divider being operable when said first transistor is conducting to establish a potential at the emitter electrode of said second transistor which is between that of said source and said point of reference potential whereby the second transistor is rendered non-conductive at a different base potential than that at which it is rendered conductive.

3. In a transistor oscillator circuit having a point of reference potential: a first normally non-conducting transistor having its collector and emitter electrodes interconnected through a load and a source of direct current; a second normally non-conducting transistor; a capacitor connecting the base electrode of said second transistor to the collector electrode of said first transistor; a first resistor connecting the collector electrode of said second transistor to the base electrode of said first transistor; a second resistor connecting the emitter electrode of said second transistor to the collector electrode of said first transistor; a third resistor connecting the emitter electrode of said second transistor to said point of reference potential; a fourth resistor connecting the emitter electrode of said first transistor to the base electrode of said second transistor; and a fifth resistor connecting the base of said second transistor to said point of reference potential; the emitter electrode of said second transistor being held at substantially reference potential when said transistors are not conducting; said fourth and fifth resistors forming a voltage divider operable in coaction with said capacitor to alter the potential at the base electrode of said second transistor relative to the emitter electrode thereof whereby the second transistor is rendered conductive and energizes the base electrode of said first transistor causing it to conduct; said capacitor connection between the collector electrode of said first transistor and base electrode of said second transistor then operating as a feedback coupling to increase the current flow to the base electrode of the second transistor whereby both transistors are brought to a state of full conduction and substantially the full potential of said current source is applied across said load; said second and third resistors forming a voltage divider when said first transistor is conducting to substantially alter the potential at the emitter electrode of said second transistor whereby the latter is rendered nonconductive at a different base electrode potential than that at which it is rendered conductive.

4. In a transistor oscillator circuit: a source of direct current, a load and a first transistor connected in series; a second transistor having its collector electrode connected to the base electrode of said first transistor; voltage divider means connected across said source; the base electrode of said second transistor being connected to an intermediate point on said voltage divider means; said last named connection including a potentiometer for controlling frequency; a capacitor connected between the base electrode of said second transistor and the collector electrode of said first transistor; said voltage dividing means and capacitor cooperating to alter the potential at the base electrode of said second transistor relative to the potential at the emitter electrode thereof whereby said second transistor is rendered conductive and energizes the base electrode of said first transistor to enable a closed circuit to be established through said source, load and first transistor, and a second voltage divider in said circuit operable when said first transistor is conducting to substantially alter the potential at the emitter electrode of said second transistor.

References Cited in the file of this patent

UNITED STATES PATENTS

| | | |
|---|---|---|
| 2,788,449 | Bright | Apr. 9, 1957 |
| 2,829,257 | Root | Apr. 1, 1958 |
| 2,831,113 | Weller | Apr. 15, 1958 |
| 2,890,353 | Overbeek et al. | June 9, 1959 |
| 2,901,669 | Coleman | Aug. 25, 1959 |